(12) United States Patent
Nair et al.

(10) Patent No.: US 8,698,328 B2
(45) Date of Patent: *Apr. 15, 2014

(54) MECHANICAL ENERGY HARVESTER

(75) Inventors: Balakrishnan Nair, Sandy, UT (US); Jesse Alan Nachlas, Salt Lake City, UT (US); Andrew Joseph Gill, Salt Lake City, UT (US); Zachary Murphree, Salt Lake City, UT (US)

(73) Assignee: Oscilla Power Inc., Salt Lake City, UT (US)

(*) Notice: Subject to any disclaimer, the term of this patent is extended or adjusted under 35 U.S.C. 154(b) by 75 days.

This patent is subject to a terminal disclaimer.

(21) Appl. No.: 13/336,843

(22) Filed: Dec. 23, 2011

(65) Prior Publication Data

US 2013/0002056 A1  Jan. 3, 2013

Related U.S. Application Data

(63) Continuation-in-part of application No. 13/016,828, filed on Jan. 28, 2011, now Pat. No. 8,378,512, and a continuation-in-part of application No. 13/333,173, filed on Dec. 21, 2011.

(60) Provisional application No. 61/437,586, filed on Jan. 28, 2011, provisional application No. 61/482,146, filed on May 3, 2011, provisional application No. 61/526,640, filed on Aug. 23, 2011.

(51) Int. Cl.
*F03G 7/00* (2006.01)

(52) U.S. Cl.
USPC ............................ 290/1 R; 290/42; 290/53

(58) Field of Classification Search
USPC ...................... 290/42, 44, 53, 55, 1 R
See application file for complete search history.

(56) References Cited

U.S. PATENT DOCUMENTS

| | | | | |
|---|---|---|---|---|
| 8,212,436 | B2 * | 7/2012 | Nair et al. | 310/26 |
| 8,378,512 | B2 * | 2/2013 | Nair et al. | 290/42 |
| 2006/0255663 | A1 * | 11/2006 | Vlad | 310/26 |
| 2008/0092354 | A1 * | 4/2008 | Clingman et al. | 29/25.35 |
| 2013/0033130 | A1 * | 2/2013 | Nair et al. | 310/26 |

* cited by examiner

*Primary Examiner* — Tho D Ta
(74) *Attorney, Agent, or Firm* — Jeffrey T. Holman

(57) ABSTRACT

Embodiments of an apparatus for harvesting electrical power from fluid motion are described. The apparatus includes a magnetostrictive component having an internal pre-stressed magnetostrictive core. A magnetic property of the magnetostrictive core is configured to change with changes in stress within the magnetostrictive core along at least one direction within the magnetostrictive component. Also, forces at least partially due to fluid motion results in changes of stress within the magnetostrictive core and consequently change the magnetic property. The magnetostrictive component is further configured such that the change in the magnetic property will result in a change in the magnetic flux, which can be used to generate electrical power.

20 Claims, 8 Drawing Sheets (a) Illustration of the change in dimensions of a magnetostrictive material under the influence of a magnetic field (b) Dependence of magnetostriction strain on the applied magnetic field Comparison of Magnetoelastic coupling of Fe-Al with Fe-Ga and Fe-Be as reported by Clark et al.

Magnetic and Magnetostrictive properties of Alfenol as reported by Davis and Ferabee Dependence of the Magnetic field (B) in Fe-18.4 At% Ga at various bias fields and compressive stresses; the black solid arrow indicates the direction of increasing bias magnetic fields Pre-compression loading fixture

MECHANICAL ENERGY HARVESTER

STATEMENT OF FEDERALLY SPONSORED RESEARCH

Aspects of this invention made with Government support under U.S. Grant No. WC133R10CN0220 awarded by National Oceanic and Atmospheric Administration. The Government has certain rights to those aspects of this invention.

CROSS-REFERENCES TO RELATED APPLICATIONS

This application claims priority to U.S. application Ser. No. 13/016,828, filed Jan. 28, 2011, and entitled "Wave Energy Harvester with Improved Performance," incorporated herein by reference herein in its entirety, which claims the benefit of U.S. Provisional Application No. 61/300,438, filed Feb. 1, 2010, and entitled "Wave Energy Harvester with Improved Performance" which is incorporated by reference herein in its entirety. This application further claims the benefit of U.S. application Ser. No. 13/333,173, filed Dec. 21, 2011, and entitled "Vibration Energy Harvesting Apparatus," incorporated by reference herein in its entirety, which claims the benefit of U.S. Provisional Application No. 61/425,475, filed Dec. 21, 2010, and entitled "Vibration Energy Harvester Method and Device" which is incorporated by reference herein in its entirety. This application further claims the benefit of U.S. Provisional Application No. 61/437,586, filed Jan. 28, 2011, and entitled "Energy Harvesting Methods and Devices, and Applications thereof" which is incorporated by reference herein in its entirety. This application further claims the benefit of U.S. Provisional Application No. 61/482,146, filed May 3, 2011, and entitled "Method and Device for Vibration Energy Harvesting" which is incorporated by reference herein in its entirety. This application further claims the benefit of U.S. Provisional Application No. 61/526,640, filed Aug. 23, 2011, and entitled "Method and Device for Mechanical Energy Harvesting" which is incorporated by reference herein in its entirety.

BACKGROUND

Wide deployment of renewable energy sources that are both commercially viable and environmentally benign unquestionably ranks as one of today's global grand challenges. Such technologies will not only fuel economic growth and contribute to global environmental sustainability, but also reduce our dependence on exhaustible fossil fuels in the coming decades. Ocean power remains a very high potential but under-utilized source for clean energy that would accomplish these objectives.

The Energy Information Administration estimates that global electricity consumption will increase from 18 to 32 trillion kWh between 2006 and 2030, reflecting an annual growth rate of 2.4%. Coal power is forecast to deliver 42% of this global increase, followed by renewables at 24% and natural gas at 23%, with nuclear power contributing the balance. U.S. electricity consumption will increase at a slower rate, climbing from 4.1 to 5.2 trillion kWh over this time period. Coal power is forecast to deliver 39% of this domestic increase, followed by renewables at 32% and natural gas at 18%. The bulk of the contribution from renewables is projected to come from new hydropower rather than less environmentally compromising renewables.

The identification and development of new cost-effective, energy-efficient and environmentally friendly power generation technologies will result in economic, health and security benefits to the US and global populations. Since clean energy generation is generally based on local resources, these technologies can help fuel the local economies of coastal areas through job creation and the availability of inexpensive energy to fuel local industries.

A high proportion of the market share growth in the clean energy sector will go to energy sources that have the capital efficiency, cost effectiveness, and resource availability to scale quickly over the next two decades. Conventional approaches to harvesting ocean energy have been delinquent across all three of these criteria—they are too capital intensive, have non-competitive energy costs, and require very specific ocean environments which limits the number of potential locations and thus the scale of impact. As such, conventional ocean energy systems are not considered to be in the same class as wind, solar photovoltaic, solar thermal, and geothermal when it comes to impact potential.

The cost of electricity from conventional devices is estimated to be 3-5 times that of coal power. Without radical departures from the conventional approach tried to date, it is plausible that ocean energy will never be a material part of the global energy mix.

SUMMARY

Embodiments of an apparatus are described. In one embodiment, the apparatus is an apparatus for harvesting electrical power from fluid motion. The apparatus includes a magnetostrictive component having an internal pre-stressed magnetostrictive core. A magnetic property of the magnetostrictive core is configured to change with changes in stress within the magnetostrictive core along at least one direction within the magnetostrictive component. Also, forces at least partially due to fluid motion results in changes of stress within the magnetostrictive core and consequently change the magnetic property. The magnetostrictive component is further configured such that the change in the magnetic property will result in a change in the magnetic flux, which can be used to generate electrical power.

Embodiments of a method are also described. In one embodiment, the method is a method for precompressing a magnetostrictive component for harvesting electrical power from fluid motion. The method includes loading a magnetostrictive component into a frame unit. The magnetostrictive component includes a magnetostrictive core positioned between two structural plates. The method further includes compressing the magnetostrictive core by activating a mechanical compression unit. The mechanical compression unit compresses the magnetostrictive core by applying force to the structural plates. The method further includes attaching at least one rod between the structural plates and fastening the at least one rod to the structural plates with a fastening unit.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
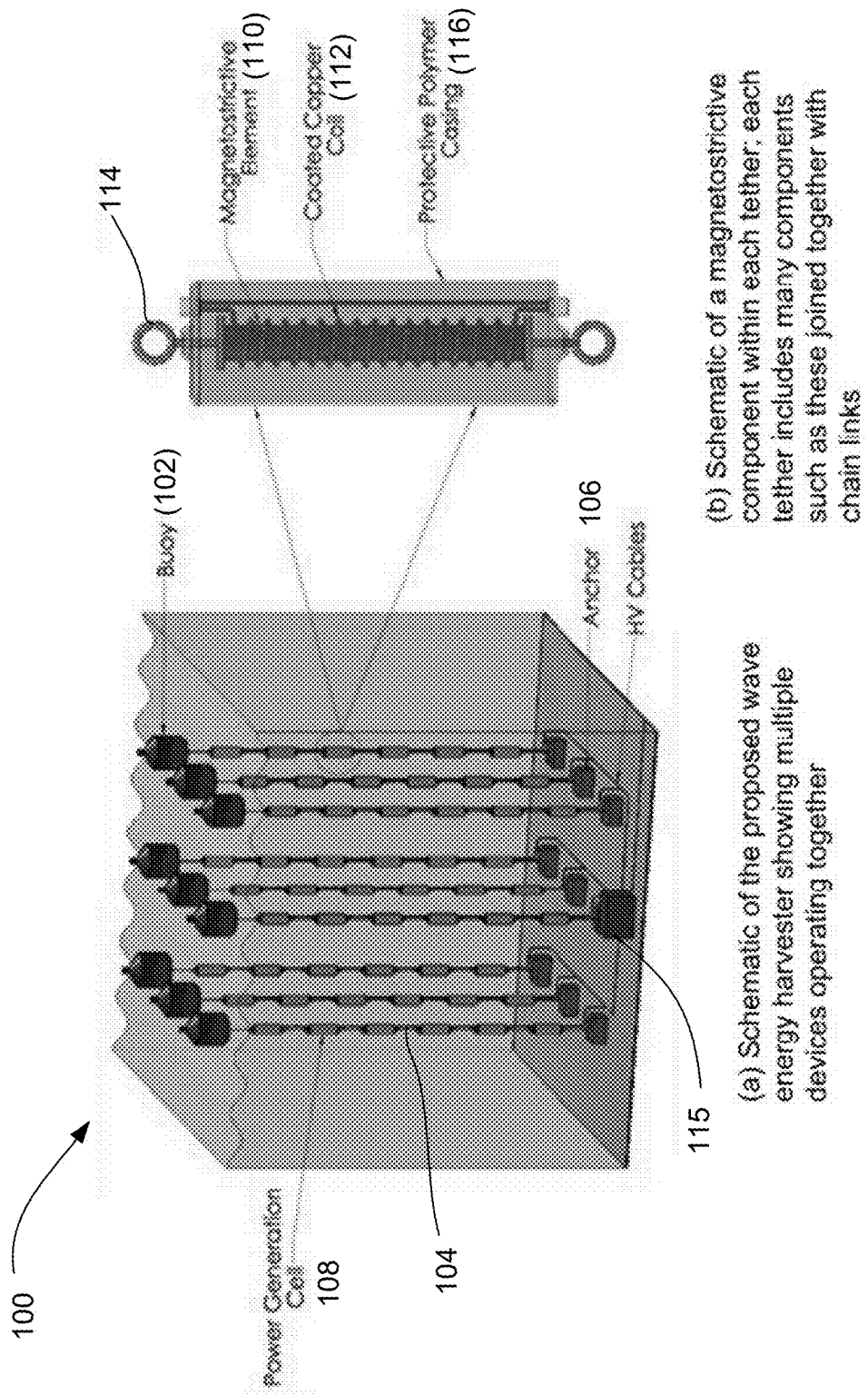
FIG. 1 depicts a schematic diagram of one embodiment of a wave energy harvester.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments describe a wave energy harvesting system utilizing magnetostrictive materials that can enable highly cost-efficient energy harvesting from ocean waves, or other wave environment, while providing extremely good durability and reliability. Embodiments also relate to a method and device for harvesting ocean wave energy that has the potential to deliver energy that is equal to or lower in cost than coal based power generation without subsidies or incentives. The method involves converting the mechanical energy of oscillating ocean waves into magnetic and then electrical energy using magnetostrictive materials. For the purposes of this description, a magnetostrictive material may be considered to be any material that can be designed or configured such that a change in applied stress can result in a change in the magnetic flux and/or magnetic field (the B-field) within the material. Another embodiment of the wave energy harvester ("WEH") may have a significant benefit on the ocean energy landscape due to its unique combination of low capital/maintenance costs, ruggedness and reliability relative to competing technologies and ability to function well in low to moderate wave-height locations. Furthermore, embodiments described herein include the first known ocean device that uses advanced materials as a substitute for moving parts, thereby minimizing one of the main engineering challenges in the ocean environment. While detailed power and cost modeling indicates that a device using magnetostrictive alloys such as iron-aluminum can be competitive with coal based power generation, significant improvement may be achieved by identifying and implementing specific design improvements that can increase the magnetic field change achieved within the material.

In one embodiment, the WEH is a device that captures the energy of oscillations in ocean waves and converts this energy to electrical energy. FIG. 1 depicts a schematic diagram of one embodiment of a WEH 100, which may include a plurality of WEH devices. Each WEH device includes a buoy 102 or other water flotation device attached to a tether 104 that is connected to an anchor on the sea floor as shown in FIG. 1(*a*). The tether 104, which is anchored to the seafloor using heavy weights and/or concrete (or other fastening mechanism) as anchors 106, may include one or more magnetostrictive components 108 (shown as "Power Generation Cells" in FIG. 1), which include magnetostrictive cores 110 (also referred to as magnetostrictive elements) having copper coils 112 around the cores 110 and connected to each other through chain links 114. The anchors 106 may be permanently fixed to the sea floor at a particular location in some embodiments. In one embodiment, the water flotation device is inside an oscillating water column.

A schematic of one embodiment of the magnetostrictive components 108 that make up the tether 104 is shown in FIG. 1(*b*). The magnetostrictive components 108 may include magnetostrictive cores 110 wound with polymer (e.g. Teflon, polytetrafluoroethylene) coated copper wire 112 to the desired number of turns as shown in FIG. 1(*b*). When a strain is imposed on magnetostrictive cores 110, it results in a change in a magnetic property of the magnetostrictive core 110. Such magnetic properties include the core's magnetization (or flux density) and the associated magnetic field (See FIG. 2). In one embodiment, the magnetostrictive elements are encased in structural casings 116 that are corrosion-resistant and water-tight, but allow for the majority of the tether load to be transferred to the magnetostrictive core 110 and also allow for water tight electrical connections. Each WEH device may be electrically connected to an electrical energy storage device 115. The electrical energy may be transformed or modified in any way, or may be transmitted to locations or devices.

Figure 2:
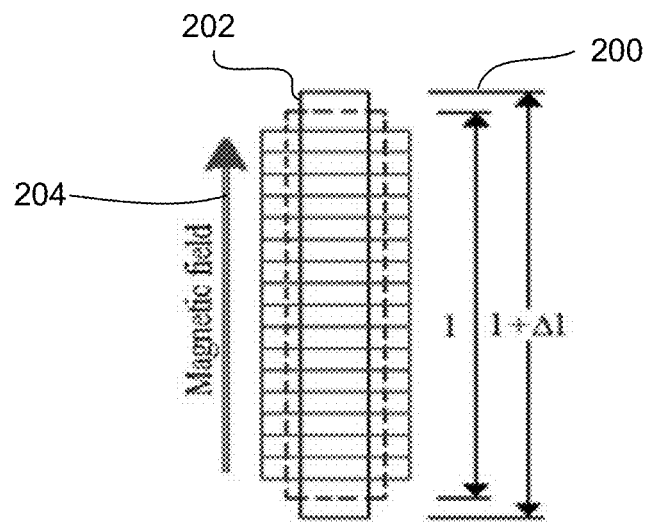
FIG. 2 depicts a schematic diagram of one embodiment of dimensions of a magnetostrictive material and a graph diagram of its associated magnetic field.
Figure 2:
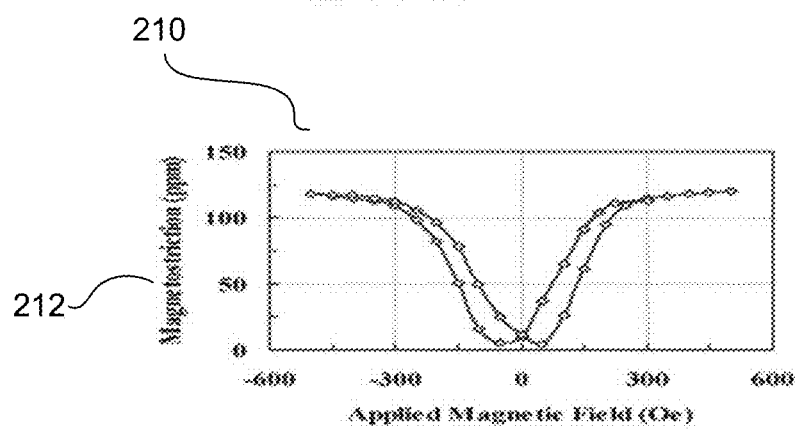

FIG. 2 depicts a schematic diagram of one embodiment of dimensions 200 of a magnetostrictive material and a graph diagram of its associated magnetic field, according to the strain on the device. FIG. 2(*a*) illustrates a range of dimensions 200 that a magnetostrictive material may experience when a magnetic field 204 is applied to the material 202. FIG. 2(*b*) is a graph 210 that illustrates a dependence of magnetostriction strain 212 on the applied magnetic field 204 of a particular magnetostrictive material.

In one embodiment, the WEH's buoys 102 are designed such that their vertical length exceeds the expected amplitude of oscillations of normal wave motion expected at the geographic location of interest. The WEH 100 may also be designed such that even as a wave is at its trough, the submerged height of the buoy is more than what it would have been if the buoy 102 was not tethered to the ocean floor. In this embodiment, the buoy 102 is always partially submerged whether it is at the crest or the trough of a wave. This ensures a tensile load on the magnetostrictive components 108 through the entire range of motion of the oscillating buoy 102. When a wave moves past a WEH buoy 102, the geometry outlined here causes the line tension in the tether 104 to be a strong function of the wave amplitude. When the passing wave is at its crest, more of the buoy 102 is submerged in water resulting in a greater tensile load on the magnetostrictive component 108. When the passing wave is at its trough, less of the buoy is submerged resulting in a lower tensile load on the magnetostrictive component 108. In order to optimize power production, the geometry of the individual magnetostrictive cores 110 is specified such that for a given buoy 102, the expected loads generated will result in strains that are below the saturation magnetostriction. As the wave oscillates past each buoy 102, the extension of the magnetostrictive element follows a similar oscillation, resulting in a constantly changing magnetic flux density along the length of the magnetostrictive element. This constantly changing magnetic flux density may be used to induce voltage/current in the copper coil 112.

One embodiment of the WEH 100 has at least three features that give it the potential to be a breakthrough in ocean power (although other embodiments may have less than all of the listed features):

1) Initial cost modeling indicates that energy cost as low as 2-4 cents/kWh is feasible based on reasonable assumptions using existing alloy materials. This compares with 10-20 cents/kWh projected from conventional approaches to ocean power.
2) The lack of any moving parts enables very high reliability and lifetime. A major weakness of many current and proposed ocean energy devices is their reliance on mechanical components such as gears, cranks, cams, pistons etc. In the ocean environment, corrosion or salt spray deposition can dramatically increase the friction and reduce the effectiveness of these components.
3) The technology will work well under conditions of low to moderate sustained winds (i.e., moderate wave heights) in addition to areas with high wave heights, making the technology complementary to off-shore wind systems that are optimal for areas of higher wind speeds and moderate wave heights.

The technology is clean and creates electricity from ocean waves without consuming any carbonaceous fuels or generating any harmful pollutants. Even compared with other technologies for harvesting ocean power, the lack of moving parts and joints that require lubrication that may leak and pollute the oceans, this technology is exceptionally clean and environmentally friendly. The substitution of the energy generated by these approaches over fossil fuels will reduce green house gases and pollutants without any undesirable side-effects or compromises. Finally, the technology is friendly to marine life as the structures will not result in any impediment to natural migration patterns or affect sea-life in any significant way.

Some embodiments may also be used in compression. In a compression configuration, the application of a compressive stress can reduce the magnetic flux in the orientation of the applied stress and the relieving of the compressive stress results in an increase in flux density.

The improvements outlined herein can further reduce WEH 100 system costs and increase system performance. Specifically, embodiments of the apparatus focus on improving the power density of low-cost magnetostrictive devices, through specific materials, component design and/or manufacturing enhancements, which can significantly reduce electricity costs.

Embodiments of the apparatus cover any device or method for harvesting or generating electric power that incorporates a magnetostrictive component 108, which includes a component containing a material whose magnetic properties change as a function of applied stress at least along one direction within the material. One embodiment covers any device or method for harvesting or generating electric power from the ocean that incorporates a magnetostrictive component 108, which includes a component containing a material whose magnetic properties change as a function of applied stress at least along one direction within the material. Another embodiment includes a device or method for causing a periodic change in stress/strain in the magnetostrictive component 108 by coupling it to a buoy 102. Magnetic properties include, but are not limited to, saturation magnetization, derivative of magnetization with respect to applied stress, magnetostrictive strain and magnetic permeability. This disclosure also covers processes, designs and materials that are intended to create states of pre-stress and/or pre-strain and/or magnetic bias within the magnetostrictive component. These states of pre-stress and/or pre-strain and or magnetic bias may either be created internal to the magnetostrictive material during materials processing, or be caused in the material by mechanically or magnetically coupling with secondary components.

Magnetostrictive materials have primarily been used for actuator applications, and so far most of the efforts by researchers who study magnetostriction tend to focus largely on this application. Since the primary objective of an actuator is to deliver displacement against a load, the key requirement for these applications is a high saturation magnetization. This need drove the development of new exotic materials such as terbium alloys (e.g. Terfenol-D) that had saturation magnetizations of up to 2000 ppm. However, the saturation magnetization strain is not a key parameter for energy harvesting applications. More important are parameters such as magneto-mechanical coupling coefficients (a measure of the energy that can be converted from magnetic energy to mechanical energy and vice versa), and the maximum magnetization change under applied tensile stress.

Figure 3:
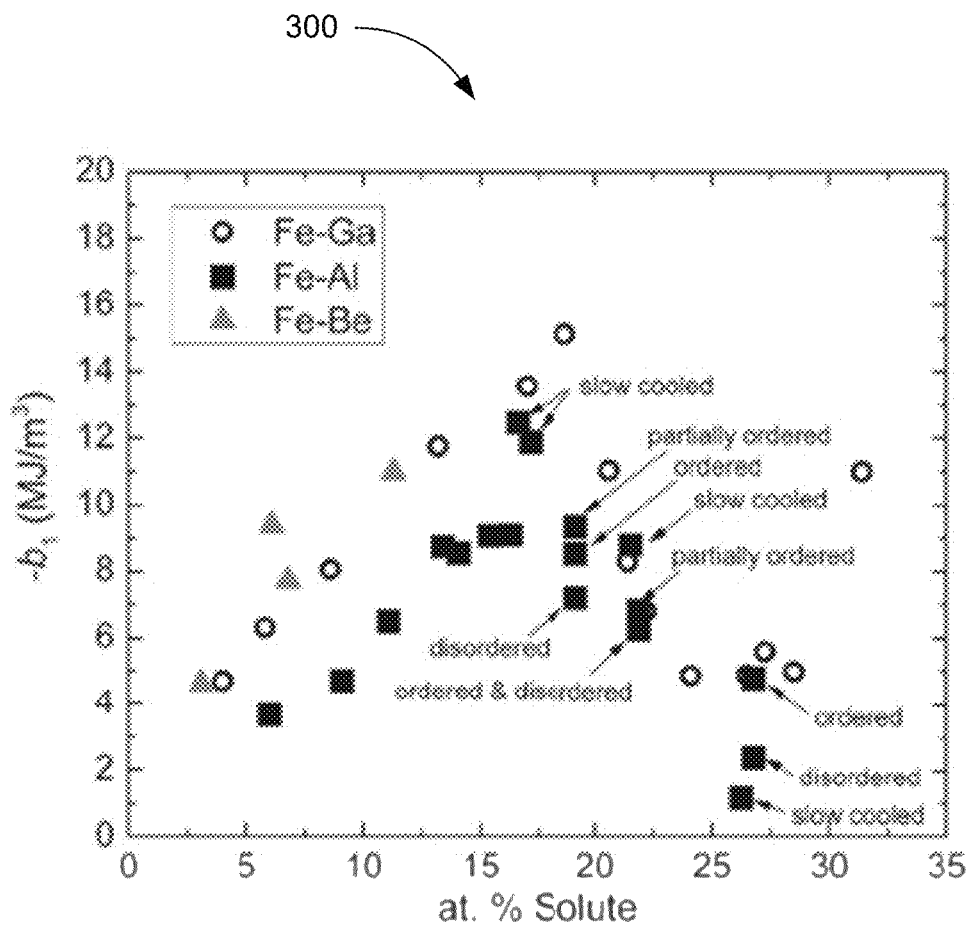
FIG. 3 depicts a graph diagram of one embodiment of a comparison of magneto-mechanical coupling coefficients for various magnetostrictive materials.
Figure 4:
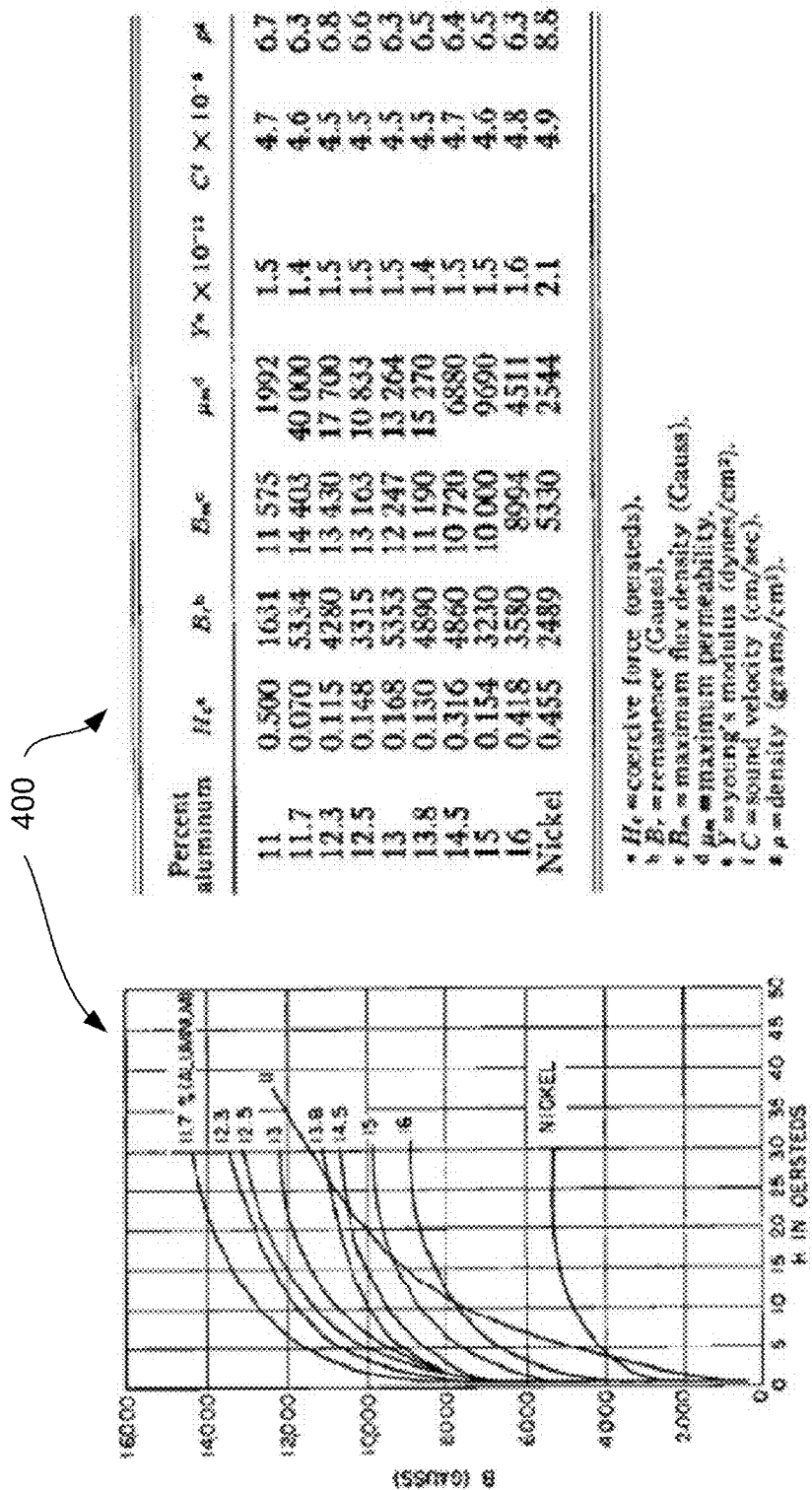
FIG. 4 depicts a graph diagram of one embodiment of magnetic and magnetostrictive properties of Alfenol.

In many embodiments, inexpensive "low performance" magnetostrictive materials such as iron aluminum alloys are more than sufficient to generate significant utility scale energy. Iron-aluminum alloys were first explored as magnetic alloys in the 1950s—while they have moderate saturation magnetostriction values (100-140 ppm), their magneto-mechanical coupling can approach that of iron-gallium and values as high as 13.7 Mega-Joules/m3 have been measured for Fe-16% Al (See FIG. 3). FIG. 3 depicts a graph diagram of one embodiment of a comparison 300 of magneto-mechanical coupling coefficients for various magnetostrictive materials. This is a measure of the maximum energy that can be converted from magnetic to mechanical and vice-versa in one stress/strain cycle. It may be desirable in some embodiments to increase the saturation magnetization of the alloys, and one method and device for improving the saturation magnetization is by appropriate alloy selection. Prior work done on iron-aluminum alloys indicates that saturation magnetization may be maximized between 11 and 13% aluminum (see FIG. 4). FIG. 4 depicts a graph diagram of one embodiment of magnetic and magnetostrictive properties 400 of Alfenol.

Possible criteria for material selection include the following:
1. For high energy efficiency, a high value for the derivative of the magnetization with respect to stress can be used. In other words, a small change in stress should result in a high change intensity of the magnetic field.
2. The material should possess low hysteresis in the strain-magnetization curve. The low hysteresis will result in low magnetomechanical coupling losses, again resulting in improved energy efficiency.
3. The material should have a high internal resistance. A high internal resistance of the alloy results in minimization of eddy currents within the magnetostrictive components and resulting heat generation/energy loss.
4. The material should be of very low cost (cents/kWh) and therefore exotic/rare and high-cost alloying elements may be avoided.
5. The material should be of low weight (cents/kg) to help reduce installation costs.

Gallium, terbium, or dysprosium doping may or may not be attractive for bulk applications where several tons of material will be needed for MW scale energy production. Alloying with trace elements such as Co, Mn, W and Mo to target three phase alloy compositions with small additions of these metals (under 20 atomic %, and preferably under 5 atomic %) into the Fe—Al system has shown promising improvements in various properties as indicated below:
Co—Cobalt alloying of Fe or Fe—Al may improve magnetomechanical coupling coefficient and magnetoelastic coupling (MJ/m$^3$).
Mn—Addition of Mn has been shown to increase the electrical resistivity of Fe—Ga alloys without significant magnetostriction deterioration. A higher electrical resistivity can help to minimize eddy current losses in the magnetostrictive material and increase energy efficiency.
Mo—Mo additions up to 4% in Fe—Al alloys have shown to reduce corrosion weight losses by an order of magnitude. Fe—Al—Mo alloys have been shown to be strong and ductile, while possessing magnetostrictive properties.
W—Fe—Al—W alloys have been shown to be strong and ductile, while possessing magnetostrictive properties.

There have been a few publications that have looked at vibration energy harvesting using magnetostrictive devices. These devices tend to be very small devices designed for MEMs systems that can generate under 1 Watt, again consistent with the common perception that magnetostrictive materials are expensive, and suitable only for niche low-power applications. However, while these devices were not pushed to determine the maximum power efficiency, this body of work has shown energy efficiency from mechanical to electrical energy of 60-80% in constant displacement mode over a wide range of frequency (0-2000 Hz) using magnetostrictive materials.

Figure 5:
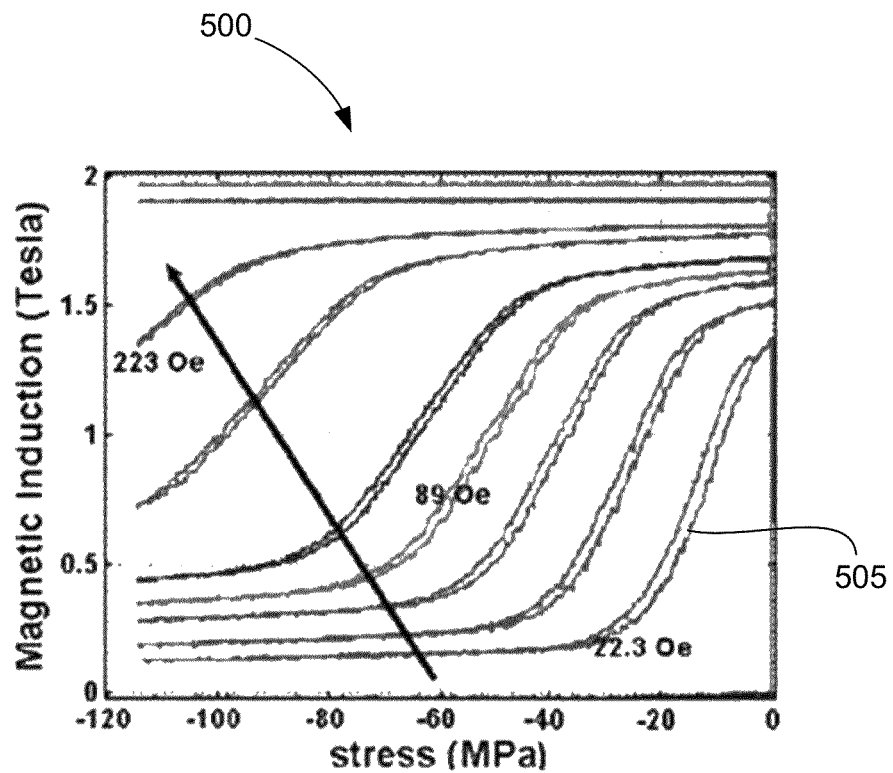
FIG. 5 depicts a graph diagram of one embodiment of an effect of bias magnetic fields and compressive stress on a magnetostrictive material.

FIG. 5 depicts a graph diagram of one embodiment of an effect 500 of bias magnetic fields and compressive stress on a magnetostrictive material. In magnetostrictive materials, the application of a compressive stress reduces its magnetic permeability in the direction of the applied compressive stress. Specifically, the application of a compressive pre-stress impacts the magnetic permeability, and therefore the magnetic flux density (B) within the alloy for a given applied magnetic field (h). This effect has been studied in great detail for new magnetostrictive materials such as iron-gallium (Fe—Ga) alloys, and the data is shown in FIG. 5. At higher compressive stress, a greater field is required to reorient the magnetic moments parallel to the axis of the sample. Thus, at larger compressive stresses, a higher bias magnetic field is required to reorient the magnetic moments parallel to the sample. Stated another way, at larger compressive stresses, a higher bias magnetic field is required to reach saturation magnetization. This phenomenon can be utilized to generate a significant change in magnetic permeability and therefore magnetic flux density within magnetostrictive materials with a change in tensile stress. For example, consider the curve 505 for the bias magnetic field of 22.3 Oe in FIG. 5. If the material has a pre-compressive stress of 30 MPa, the magnetic field within the material is around 0.3 Tesla. If we apply an incremental tensile stress of 30 MPa that essentially eliminates this compressive stress, the magnetic field within the material increases to around 1.4 Tesla, resulting in a change of over 1.1 Tesla of magnetic field for a tensile stress of 30 MPa.

Fe—Ga is very similar to Fe—Al, except in the fact that it has a greater magnetostrictive strain. Since the Fe—Al alloys were originally developed in the 1950s and largely ignored since then due to their relatively small magnetostrictive strains, very little is known about the interaction between pre-compressive stresses, bias magnetic fields and magnetic permeability. We do know from the available data that maximum saturation magnetization may be as large as 1.6 Tesla for Fe—Al alloys.

In some embodiments, methods and devices are included to incorporate magnetostrictive components with the appropriate combination of bias magnetic field and pre-stress that will provide the maximum change in the B-Field in specific magnetostrictive alloys into systems that are designed to generate electric power. In one embodiment, methods and devices are included to incorporate magnetostrictive components 108 with the appropriate combination of bias magnetic field and pre-stress that will provide the maximum change in the B-Field in specific magnetostrictive alloys into systems that are designed to generate electric power by harvesting energy from the ocean. For a specific alloy, magnetic measurements similar to that shown in FIG. 5 can help identify the appropriate combination of bias magnetic field and pre-stress which maximize the change in magnetic field as a function of external applied stress. In one embodiment, the pre-stress force may be a compressive stress, and the applied external stress may be a tensile stress. In one embodiment, the applied stress is periodic. In one embodiment, the applied stress is caused by changes in tether tension in a system with a tethered buoy 102. In one embodiment, the change in magnetic field is at least 0.1 Tesla, and preferably at least 0.5 Tesla. The specific magnetostrictive alloy composition used in no way limits the scope of the method or apparatus.

After identifying the appropriate combination of bias magnetic fields and pre-compressive stresses that achieve a desired B-Field change in the selected magnetostrictive alloy component, the next step is to incorporate this into a component design and to develop a manufacturing process that achieve these target values while minimizing component costs.

For achieving the bias magnetic field, at least one permanent magnet incorporated in the vicinity of the magnetostrictive element or component may be used. The magnet or magnets may be internal to or external to the magnetostrictive component. Embodiments described herein are not specific to the use of permanent magnets, and persons skilled in the art can envision various configurations of permanent magnets or electromagnets to be used for achieving the same or similar bias fields. One embodiment incorporates permanent magnets with the magnetostrictive elements. One embodiment incorporates magnetostrictive components that have one or more bores into which permanent magnets may be incorporated. Magnetic field modeling can be used to design low cost permanent magnet assemblies (based on small rare earth magnets that can achieve the bias fields using, for example, Vizimag 3.18 software. Vizimag software is an electromagnetic modeling simulator software for analysis and simulation of field lines and flux density. The software can be used to analyze fields due to rectangular, toroidal and curved magnets, solenoids and their interaction with user-defined magnetic regions. In some embodiments, a relatively uniform magnetic field of a particular strength is achieved, while reducing or minimizing the number/volume of permanent magnets needed to achieve this field.

In some embodiments, a process to assemble magnetostrictive cores 110 and/or components 108 into mechanical fixtures can be used to pre-stress the cores 110 or components 108. In these compression fixtures, strain sensors attached to the magnetostrictive components can be used to determine the stress/strain state of the component that is being loaded. Alternatively, in these compression fixtures, load cells can be used to determine the stress/strain state of the component that is being loaded. Magnetic field measurement systems such as Tesla Meters to determine the change in magnetic field under compression to determine both the appropriate strain/load conditions to achieve the desired magnetic domain orientation within the materials may be used in real-time during the manufacturing process.

Figure 6:
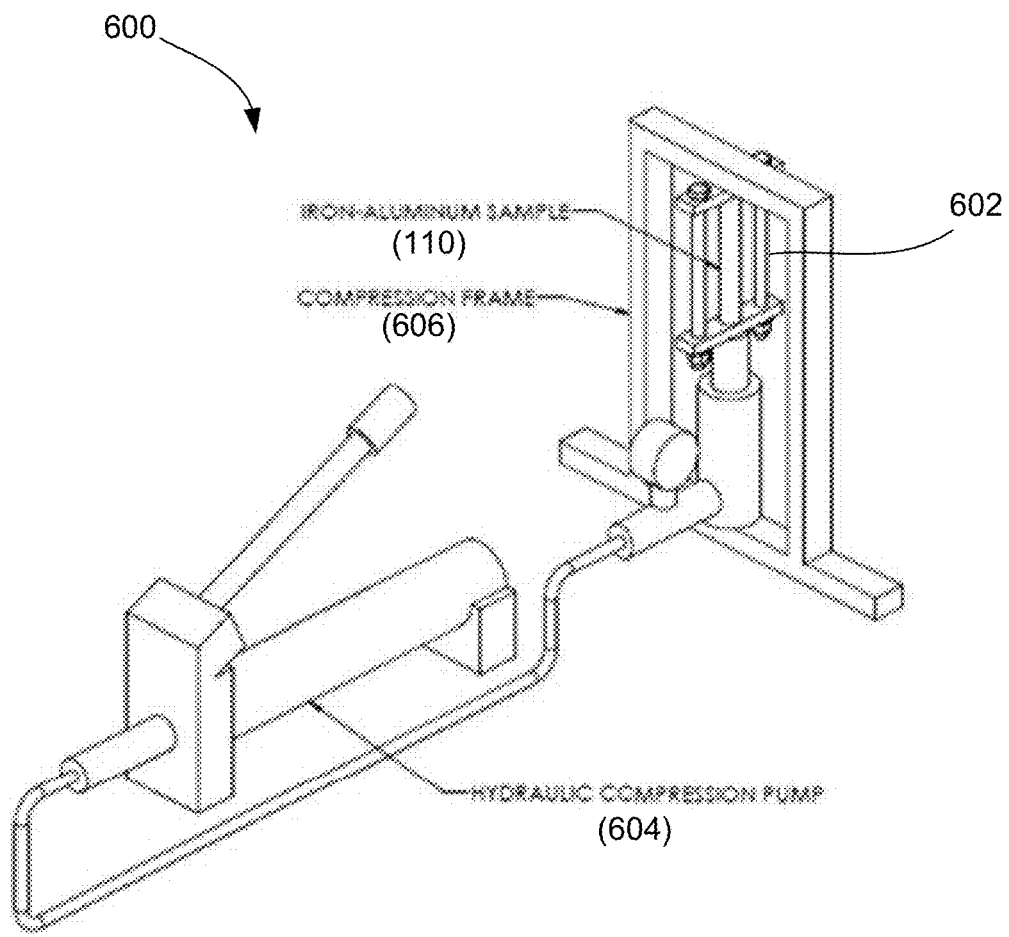
FIG. 6 depicts a schematic diagram of one embodiment of a pre-compression loading fixture.

FIG. 6 depicts a schematic diagram of one embodiment of a pre-compression loading system 600. One method of pre-stressing the magnetostrictive components includes putting the magnetostrictive alloy rod (or core 110) under a compressive load condition, in which the core 110 is installed in a fixture 602 that allows applying a compressive load using load application equipment such a hydraulic loading system 600 and the fixture 602 maintains the compressive load on the core 110 once it is removed from the loading system 600. The type and specific structure of the load application equipment does not limit the scope of the method or apparatus. If a hydraulic system 600 is used, it may include a simple hydraulic cylinder 604 and ram with a manual hand pump and an in-line pressure gauge. The fixture 602 may include two or more flat bars (or structural plates) of metal with holes drilled in them for threaded rods and nuts. The flat bars may or may not be made of a magnetically permeable alloy such as mild steel, or a relatively impermeable alloy such as stainless steel. The use of magnetically permeable flat bars may include additional bars to create a closed flux path. A sample alloy rod is installed in the fixture 602 with one or more flat bar on each end. The compression loading system 600 may include the manual hydraulic cylinder/ram 604 previously described plus an "H-Frame" 606 (or compression frame) that holds the fixture 602 while the compressive load is applied. Once the compressive load is applied to the rod/bar, the stainless steel threaded rod is passed through the holes in the flat bar and nuts are securely fastened on each end of the threaded rod. The nuts can be tightened down so that once the fixture 602 is removed from the compression loading system 600 the compressive force is maintained on the rod by the nut and bolt/s bar system. In one embodiment, strain gauges may be applied to the sample alloy rod when the process is first set up in order to ensure that the compressive force is maintained on the rod by the fixture 602 once it is removed from the loading system. The method of pre-stressing the magnetostrictive core may include using other mechanical structural components.

Figure 7:
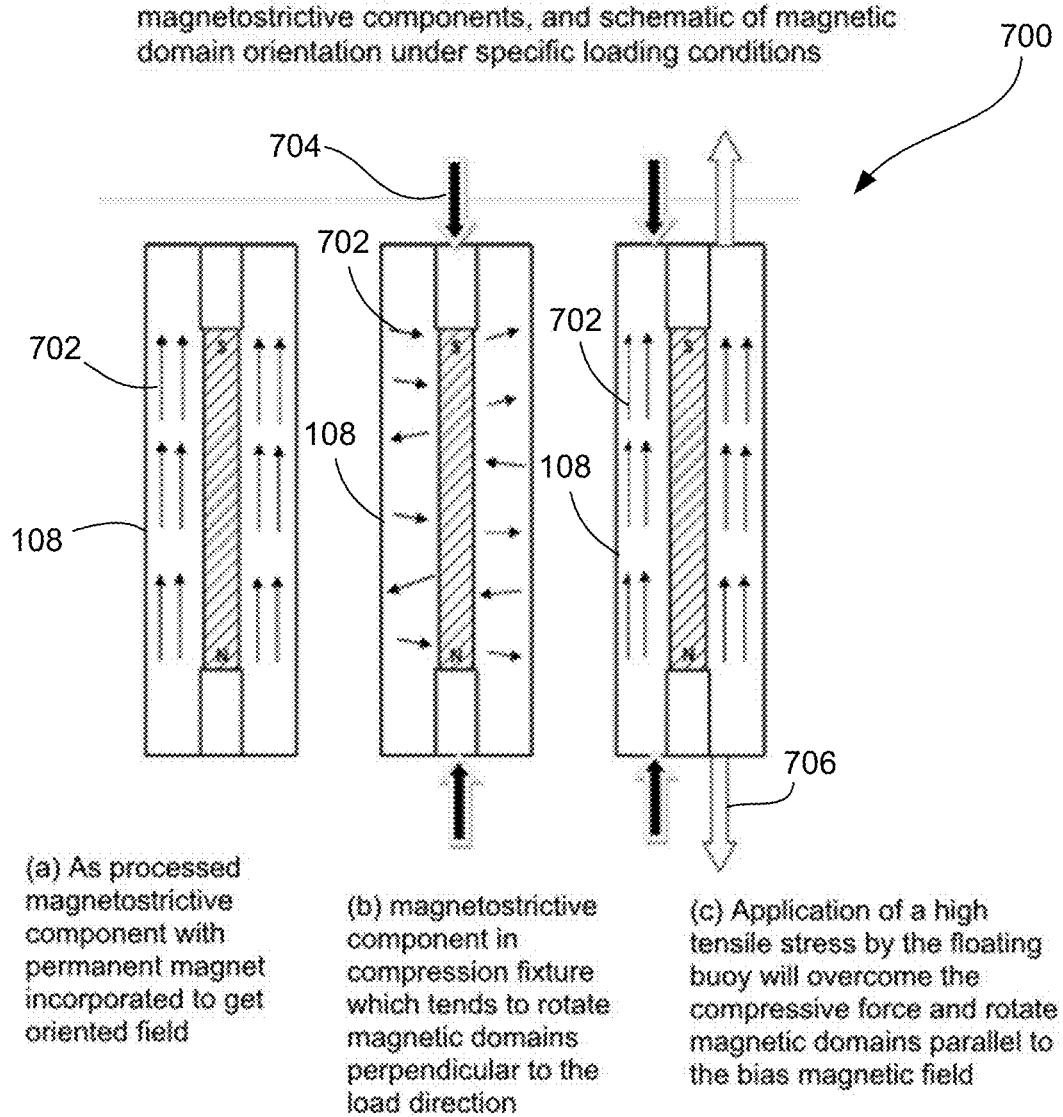
FIG. 7 depicts a schematic diagram of one embodiment of magnetic domain orientation in a magnetostrictive component under various stresses/magnetic field configurations.

FIG. 7 depicts a schematic diagram of one embodiment of magnetic domain orientation 700 in a magnetostrictive component 108 under various stresses/magnetic field configurations. Essentially, in the as-processed state, the magnetic domains 702 in the poly-crystalline alloy may be randomly oriented and have a net zero magnetic moment. By incorporating a permanent magnet to achieve a bias field 704, the domains 702 may be oriented to be parallel to the field 704. By applying a compression force on the magnetostrictive component 108 using a loading fixture 602, the magnetic domain orientations can be rotated away from the loading direction so as to be perpendicular to the loading direction. When a tensile force 706 is applied, such as by the buoy 102, the load in the magnetostrictive component 108 changes from compressive to zero or slightly tensile resulting in a complete rotation of the magnetic domains 702 and a very high efficiency of energy conversion.

The pre-stress and/or bias magnetic fields 704 (or magnetic domain orientations 702) may be incorporated into the magnetostrictive elements 110/components 108 during processing. The scope of the method or apparatus is not limited by the specific method of incorporation of pre-stress and/or bias magnetic fields 704 (or magnetic domain orientations 702) in the magnetostrictive element 108 during processing. Examples of methods that may be used include, but are not limited to, one or more of the following:
1. Quenching after processing
2. Quenching after annealing.
3. Single crystal processing
4. Grain orientation by mechanical processes such as rolling and extrusion.
5. Annealing under magnetic fields
6. Melt solidification under magnetic fields.
7. Powder compaction followed by sintering under magnetic fields.
8. Incorporation of magnetic second phases to orient the magnetic domains.
9. Incorporation of trace elements.
10. Incorporation of second phases or coatings that can result in residual stresses in the material.

Figure 8:
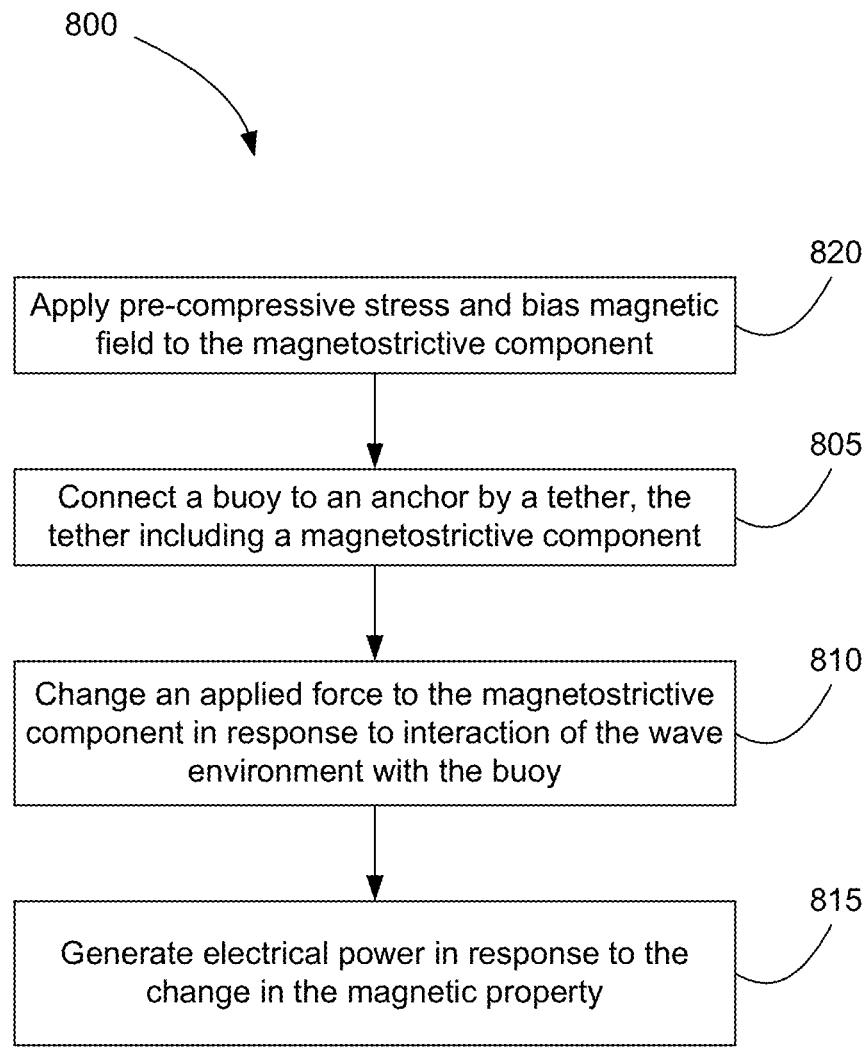
FIG. 8 depicts a flow diagram of a method for harvesting electrical power from water mechanical energy.

FIG. 8 depicts a flow chart diagram of one embodiment of a method 800 for harvesting electrical power from water mechanical, or hydrodynamic, energy. Although the method 800 is described in conjunction with the WEH 100 of FIG. 1, embodiments of the method 800 may be implemented with other types of wave or water mechanical energy harvesters.

The method 800 includes tethering 805 a water flotation device 102 to an anchor 106 by a tether 104, wherein the tether 104 includes at least one magnetostrictive component 108. A magnetic property of the magnetostrictive component 108 is configured to change upon an applied force to the magnetostrictive component 108 along a direction within the magnetostrictive component 108. In one embodiment, the applied force is a tensile force applied to the magnetostrictive core 110 of the component 108. Other embodiments may apply a compressive force.

The WEH 100 uses 810 the movement of the water flotation device 102, or buoyancy force, caused by motion of waves, wave height changes, or otherwise in conjunction with the force from the anchor 106 to create the applied force 706 and changes the magnetic property of the magnetostrictive component 108. Specifically, the applied force 706 changes a magnetic property of the magnetostrictive core 110 of the component 108. Because the applied force 706 changes the magnetic property of the component 108, the WEH 100 is able to create 815 electrical power using the change. In one embodiment, the WEH generates 815 electrical power by inducing a current or voltage in an insulated electrically conductive coil 112 magnetically coupled, wound around, or otherwise coupled to the magnetostrictive core 110 of the component 108. The coil 112 may be in electrical communication with an electrical energy storage device 115.

In one embodiment, an initial bias magnetic field 704 is applied 820 to the magnetostrictive component 108, such that the initial bias 704 results in some magnetic flux density within the magnetostrictive component 108. The bias 704 may be a magnetic bias created by permanent magnets proximate the core 110. A physical pre-stress force may be applied to the component 108 before connecting the tether to each of the buoy 102 or the anchor 106. In one embodiment, the bias magnetic field is directed through the magnetostrictive core through the use of one or more flux paths comprising magnetically permeable material. In one embodiment, both a physical pre-stress force and an initial bias magnetic field must be present in the magnetostrictive component 108 in order to generate power.

In one embodiment, a magnetostrictive element or device may utilize a moving mass. The moving mass is mechanically coupled to at least one spring element, which is in turn coupled to at least one component that comprises a magnetic strain material. The spring element may have an effective stiffness smaller than that of at least one component that comprises the magnetic strain material. In some embodiments, an electrically conductive coil may be used in the vicinity of, and/or wound around the magnetic strain material. In other embodiments, the magnetic material may include other materials which vary magnetic properties in response to strain or stress forces. In some embodiments, the magnetic strain material is a magnetostrictive material. One or more sub-components of the device including, without limitation, at least one magnetic strain material, at least one moving mass, at least one spring element and at least one coil may be incorporated in an outer container. The function of the outer container may be, without limitation, environmental protection, reliability enhancement and/or locating and guiding the motion of the moving mass.

When the device is mechanically coupled to a component or machine that is vibrating, the vibrations may induce the moving mass to oscillate at some frequency. The motion of the moving mass may cause changes in extensions of at least one spring element that is mechanically coupled with the moving mass, which in turn causes changes in strains and/or stresses within the magnetic strain material. The changes in strain or stress within the magnetic strain material cause changes in at least one magnetic property (e.g., magnetic permeability) of the magnetic strain material, which in turn may result in a current/voltage generated in the electrical coil. The electrical energy thus produced may be utilized as desired by the user of the equipment, or may aid in electrical efficiency enhancement of the component or machine.

It is expected that the amount of power generated will be proportional to approximately the cube of the vibration frequency, as is the case in piezoelectric harvesters. It is also expected that a low damping factor will increase and possibly maximize power generation, therefore embodiments of the design allow for sufficient deflections of the moving mass that can result in an expected energy production at target frequencies.

A potential benefit of one embodiment of this device is the ability to harvest energy from vibration without using any exotic, expensive or unreliable materials.

Other embodiments may also cover a method for harvesting and/or generating power using a device as described above. Various applications of the device can be construed, and the specific use of such a device in no way limits its scope. Specific embodiments of the device may be used in harvesting energy from ocean waves, wind, structural components, machines and/or vibrating components.

Some embodiments of the device may have more than one spring element and/or one or more components that comprise magnetic strain materials such as piezomagnetic or magnetostrictive materials.

Although embodiments are described herein as including a spring element, some of the embodiments may be implemented with another type of element which has the same or similar elastic properties.

Some embodiments of the device may comprise fixtures that allow the device to be attached readily and cost-effectively to vibrating machinery.

Some embodiments of the device may comprise mechanisms such as roller or sleeve bearings within the outer container that facilitate rapid motion of the moving mass with very low frictional losses.

An embodiment of an energy harvesting device includes at least one flux path composed of at least one material with a relative permeability greater than 100, at least one magnet, at least one magnetic material that has at least one magnetic property that is a function of stress on that material, and a design that allows mechanical load or vibrations to be transferred to that material, at some non-zero frequency. The magnet may be a permanent magnet or an electromagnet, and its function is to provide a bias magnetic field to the magnetic material.

In some embodiments of the device, one specific property that changes with the stress in the material is the magnetic permeability. In another embodiment, the specific property that changes with stress is the saturation magnetization. In one embodiment of the device, there are no air gaps in the flux path. In another embodiment of the device, the magnetic material is a magnetostrictive material. In another embodiment of the device, the magnetic material is put in a state of pre-stress when no external forces are acting on the material, such that when an external force does act, it may partially overcome or add to the pre-stress. In another embodiment of the device, the magnetic material is put in a state of high compressive stress, typically greater than 1000 psi, and in some embodiments greater than 5000 psi.

The device may also comprise conductive coils, such as copper coils that are configured such that changes in magnetic flux through the magnetic material will induce voltage and/or current in the coils. The type and specific configuration of the coils in no way limits the scope of this invention. In addition, the device may comprise various components and structures designed to transfer or carry load that are mechanically coupled directly or indirectly to the magnetic material.

A variety of methods and devices can be envisioned for applying and holding a pre-stress on the magnetic material including but not limited to mechanical loading with loading equipment and mechanical locking, thermal expansion based techniques and incorporation of the pre-stress during materials processing.

One or more of the devices may be used in series or parallel.

In some embodiments, the magnetic material is a metal alloy. In some embodiments, the magnetic material is an iron-based alloy. In some embodiments, the iron based alloy may contain other elements including, but not limited, to Al, Co, Cr, Ga, Si, Mo, W, Be. In some embodiments, the magnetic strain material is a terbium-based, nickel-based or cobalt-based material.

In some embodiments of the device, a magnetic flux density change greater than 0.05 Tesla is generated by changes in load on the magnetic strain material. In some embodiments of the device, changes in magnetic flux density greater than 0.3 Tesla can be obtained.

In addition to the change in flux density of the material, there are other important parameters that may determine power generation efficiency as a function of system size and cost.

One embodiment may include a fixture for applying a pre-stress load, either compressive or tensile, to the magnetostrictive element, and which may consist of magnetically permeable material and may include flux paths and permanent magnets, or electromagnets. In one embodiment, a bias magnetic field is also applied to one or more materials described in this disclosure. The fixture may include design considerations that reduce the occurrence of magnetic saturation and overall magnetic reluctance of the device. The fixture is also designed to transfer applied external loads to the magnetostrictive element to cause a change in magnetic properties of the element. The design of the fixture may seek to maximize the amount of load transferred to the magnetostrictive element. The method for applying the load may be through the use of bolts, or other means to make a rigid connection to the magnetostrictive element, which may have low magnetic permeability to reduce magnetic flux leakage. The fixture for applying the pre-stress load may include bolts. The bolt material may also be chosen to have a low Young's modulus and high yield strength. The bolt diameter may be chosen to decrease the stiffness of the bolts relative to that of the magnetostrictive element(s). The fixture may also include a method for locating the permanent magnets, for example aluminum brackets. The fixture may include two or more flat bars (or structural plates) of metal with holes drilled in them for threaded rods and nuts. The flat bars may or may not be made of a magnetically permeable alloy such as mild steel, or a relatively impermeable alloy such as stainless steel. The use of magnetically permeable flat bars may include additional bars to create a closed flux path.

One embodiment may include one or more magnetostrictive elements that are a binary alloy of iron and aluminum, with an atomic percentage of aluminum between 18% and 19%. The elements may also be a ternary alloy of iron and aluminum with the third component being either manganese, cobalt, molybdenum, or tungsten with an atomic percentage between 1% and 10%. Either the binary or ternary composition may include trace additives to improve mechanical properties such as ductility and machinability. Trace additives that serve this role include, but are not limited to: niobium, titanium, vanadium, boron, carbon, or any other element demonstrated to reduce grain growth or grain boundary fracture. In other embodiments, the magnetostrictive element includes different materials from those named, above. In other embodiments, the magnetostrictive element includes a combination of materials from those named, above, and other materials.

Embodiments of the device may include an external enclosure to protect the device from the effects of the external environment, e.g. salt-water corrosion. The external enclosure may include components designed as seals and gaskets, and may include a method for transferring the load to the internal compression fixture and magnetostrictive element. These components may be comprised of deformable seals or constituent parts. The enclosure may also have leak-tight electrical connections to connect internal and external electrical systems. The enclosure may also include methods for attaching the device to one or more tethers and/or buoys and/or other devices. In other embodiments, the enclosure may include other materials or other structures.

Embodiments of the device may be attached to one or more buoys. The buoys may be designed to have a draft sufficient to provide stability and large buoyant forces. The buoy may have connections for one or more tethers that extend from the buoy to the ocean floor. The tethers may extend from the buoy in one or more radial directions and at one or more inclination angles relative to the ocean floor to increase buoy stability, and may be comprised of magnetostrictive devices and other load-bearing members. In some embodiments, the tethers might be at an inclination angle from 1° to 89° relative to the ocean floor, and will likely be from 30° to 60°. This angle leads to improved hydrodynamic stability of the buoy, and less motion, which equates to better load transfer to the tethers and consequently the energy harvesting device. In some embodiments the groups of one or more tethers may extend from the buoy in the same radial direction, with the tether system comprising multiple such groups. Another embodiment includes another type of water flotation device in addition to, or instead of, the one or more buoys.

Some of the embodiments described can be used in drilling applications. The drilling applications may include downhole drilling applications. Some embodiments will include downhole drilling applications for oil and gas applications or for geothermal applications.

Embodiments described herein include a method and device for converting the mechanical energy from vibration and impact loads that are generated during a drilling operation into magnetic and electrical energy using a novel design that utilizes magnetostrictive elements. Embodiments of the design combine proven concepts from existing technologies with technology proven on the bench scale for energy generation using magnetostrictive devices to create a powerful solution for harvesting energy from drilling operations. Embodiments of the design are expected to have relatively low capital costs and very good survivability during downhole drilling operations. Some embodiments may include power management strategies to optimize the delivered power from a suite of devices distributed across the length of the drill string. Some embodiments will include components for applying a pre-stress to the magnetostrictive elements, or other materials described in embodiments, herein, which may be either tensile or compressive. Other embodiments will convert the mechanical energy from vibration and impact loads from other mechanical energy besides the mechanical energy generated from drilling operation. Other embodiments will convert hydrodynamic energy in combination with, or replacement of, the mechanical energy generated from vibration and impact loads.

In one embodiment, the energy generating device is mounted on the outer surface of a pipe that is part of the drill string. Attached to the surface of the pipe in a radial direction is a magnetostrictive alloy rod that is contained within a "cage". The cage consists of magnetically permeable material and bias magnets. The cage serves to create a closed path flux loop that includes the magnetostrictive alloy rod. On the top surface of the magnetostrictive alloy and flux cage is a mechanism for generating load changes on the magnetostrictive alloy rod. This loading mechanism consists of an impact head that makes contact with the rock wall in the drill hole and a compression spring. As the distance between the central drill pipe and the rock wall changes the force being applied to the compression spring changes. When the alloy rod experiences a load change generated by the compression spring and impact head there is a corresponding change in magnetic permeability in the magnetostrictive material. This results in a change in magnetic flux density passing through the magnetostrictive material as the load from the compression spring changes. This change in magnetic flux causes electrical energy to be generated in the coil that surrounds the magnetostrictive alloy rod.

The size and spring constant of the spring, along with the diameter of the magnetostrictive alloy material can all be adjusted to create a design that is suitable for a given drilling operation and/or power requirement. In addition, the number of energy generating devices can be varied to produce different power levels. In at least one embodiment, multiple components may be spaced along the length and circumference of a central drill pipe to generate more power than a single component can generate. The spacing of the components along the pipe can be done in such a way as to not impede the return flow of the drilling mud that typically flows back up the hole between the outside surface of the pipe and inside surface of the rock drill hole.

In another embodiment, a shock absorber type mechanism is used to capture the mechanical energy from impact loads from collisions with the rock wall during drilling. However, in this case the impact force load from contacting the rock wall is used to drive a piston rod in an oscillating linear motion. Then, some type of gear system or lever arm is used to transfer this oscillating motion into the tensioning of a high tension spring. The oscillating piston rod motion results in changes in the tensioning force being applied to the magnetostrictive rod assembly. The changes in tensile force being applied to the magnetostrictive alloy rod results in the generation of electrical power in the coil that surrounds the alloy rod. The advantage to this embodiment is that it allows for using a longer magnetostrictive rod that may be useful for generating higher power levels for some applications. In both of these embodiments described where an impact head is contacting the surface of the rock wall it may be desirable to include bearings or roller bearings in the surface of the impact head where it makes contact with the rock wall so that the frictional losses will be minimized and therefore have less influence on the drilling operation.

Another embodiment of this concept is to utilize the energy contained in the torsional modes of vibration, i.e. "stick-slip". Looking axially down the drill-string, the device would have magnetostrictive elements in a tangential direction, as indicated by the cross-hatched elements. As the string rotates clockwise, the blue brackets, which are connected to the upper part of the drill-string (towards the top of the well) will transfer the torque to the red brackets, which are connected to the lower part of the drill string (towards the bottom of the well) by axially loading the magnetostrictive rod. The stick-slip will cause large changes in the axial loads of the rod, which are then converted into magnetic energy through magnetostriction and subsequently electrical energy through induction. The device may consist of any number of magnetostrictive elements at a single axial location along the drill string, and any number of groups of elements along the axial dimension of the drill string. The device has a central hole through which drilling mud may flow.

Another embodiment of the device converts the bending in the drill string due to lateral vibrational loads into electrical energy. As the drill head is penetrating the rock, the drill string experiences vibrations in lateral, axial, and torsional directions. The lateral vibrations impose bending loads along the length of the drill string. In this embodiment the device has magnetostrictive material (shown in red) around the circumference of the drill collar (cross-hatched) or other external surface along the length of the drill string. Different angular positions along the circumference of the drill collar will capture the loading along different lateral directions. The changes in load experienced by the drill collar will also be experienced by the magnetostrictive material which will create magnetic energy through magnetostriction. The magnetic energy is then converted to electrical energy through induction in a coil surrounding the magnetostrictive material. The magnetostrictive material may be in the vicinity of bias magnets and flux paths to maximize the changes in flux due to the changing stress state in the material. The magnetostrictive may be in a state of pre-stress that is caused by a pre-stress fixture, such as a compression fixture. The standard geometry of the drill collar may be used, allowing mud to flow through the center. The outer envelope of the magnetostrictive material will be sufficiently smaller than the bore-hole diameter to allow mud to adequately flow out of the hole.

In one embodiment, the device includes an electric power generator for use in an environment where vibrations are present or can be produced. The embodiment includes a magnetostrictive beam assembly with two or more magnetostrictive elements which extend along a length of the beam assembly; a coil assembly in proximity to the beam assembly; a source of magnetomotive force (MMF), including permanent magnet material and/or electromagnets; and a mass assembly.

The magnetostrictive elements may be arranged to enable magnetic coupling between them. The magnetostrictive elements also may be arranged to form a beam assembly. The beam assembly also may be referred to as a cantilever beam with the fixed end rigidly attached to a supporting structure (e.g., a sidewall of a pipe, a mesh or other grating spanning at least a portion of the inner diameter of a pipe, and so forth) and the free end allowed to oscillate in response to vibration. The vibration movement alters the magnetic characteristics of the magnetostrictive elements, which results in electromagnetic induction of a voltage in the coil assembly.

In some embodiments, the magnetostrictive elements may be magnetically coupled with external flux path members that have coils around them. The changes in stress/strain in the magnetostrictive elements result in changes in flux in the magnetostrictive elements, as well as in the external flux path members, and coils may be placed around the external flux path members and/or the magnetostrictive elements so that the changes in magnetic flux can result in an induced current/voltage in these coils. This design allows for the length of the flux path and/or the number of turns of coil to be significantly greater than if coils are would around the magnetostrictive elements only. Further the average diameter (or significant dimensions) of each turn of coil may be smaller in this configuration than if the coils are wound around the magnetostrictive elements alone. This can result in a lower device internal resistance for a certain number of turns of coil, and consequently higher power density.

In some embodiments, the mass assembly is arranged such that it alters the inertia of the free end of the beam assembly to enable tailoring of the structural natural frequency of the beam assembly to affect, increase, or maximize power production.

In some embodiments, the arrangement of magnetostrictive elements defines a gap between the magnetostrictive elements such that the neutral axis of the beam assembly is located within the gap. The presence of the gap between the separate magnetostrictive elements allows a coil assembly to wrap each individual magnetostrictive element. The presence of the gap also produces stresses that are purely compressive (or substantially compressive) or purely tensile (or substantially tensile) in each magnetostrictive element, depending on the static configuration and the free end displacement. The presence of the gap also allows the individual magnetostrictive elements to forms separate portions of a closed magnetic circuit.

In some embodiments, the magnetostrictive elements are in a state of stress (termed "pre-stress") in the static configuration. This pre-stress may enhance or optimize the change in magnetic characteristics caused by vibration.

In some embodiments, the arrangement of the magnetostrictive elements, MMF source, and mass assembly form a closed magnetic circuit. This closed magnetic circuit may enhance or maximize the initial magnetic flux and magnetic characteristic changes due to vibration.

One embodiment includes at least one magnetostrictive element within a beam assembly. While the individual magnetostrictive elements may be conceptualized as individual beams (with lengthwise dimensions that are substantially greater than cross-sectional dimensions), the magnetostrictive elements are not designated herein as beams in order to distinguish between the individual magnetostrictive elements and the overall beam assembly. A magnetostrictive element, in this context, indicates any structure that is supported at least at one point and can experience loads and deflections. In one embodiment, at least one magnetostrictive element will be supported at least at one end. The magnetostrictive element may have any length or cross-sectional geometry. In some preferred embodiments, the beam will have a substantially rectangular geometry. In an embodiment in which the cross-section of the magnetostrictive elements is rectangular, the longer dimension of the rectangular cross-section is approximately perpendicular to the direction of dominant vibrations in order to increase area while maintaining a desirable structural stiffness.

Some embodiments of the beam assembly contain more than one magnetostrictive element. In some embodiments, two or more magnetostrictive elements may be separated by at least one gap, which may be an air gap or may include another material or substance within the gap.

In some embodiments, the beam assembly is supported at one end so that the magnetostrictive elements are fixed at the supported end. The magnetostrictive elements are also coupled together in a fixed manner at the unsupported end, and the neutral axis of the overall beam assembly is in the gap between the beams, which means that a deflection of the unsupported end of the beam assembly causes an incremental compressive loading in one of the magnetostrictive elements and an incremental tensile loading in the other magnetostrictive element. In some embodiments, coils may be wrapped around each magnetostrictive element individually such that the coils pass through the gap between the magnetostrictive elements. As mentioned above, the presence of the gap separating the magnetostrictive elements also allows for the magnetostrictive elements to form separate parts of a substantially closed (i.e., without substantial air gaps) magnetic circuit, which could be completed at both ends of the structure by magnetically permeable materials and/or magneto-mechanical force (MMF) sources (e.g., permanent magnet material, electromagnets, etc.). In some embodiments, these materials would be placed in the gap at both ends of the magnetostrictive elements to form a closed flux path.

Winding separate coils around each magnetostrictive element individually facilitates simultaneously utilizing the different forms of mechanical stress in the separate magnetostrictive elements, as one of the magnetostrictive elements is in compression while the other magnetostrictive element is in tension. In contrast, if a single coil were wound around the entire beam structure (i.e., around both magnetostrictive elements together), the ability to induce electricity from flux changes would be diminished or entirely prevented due to the cancelling effect of the opposite mechanical stresses in the magnetostrictive elements. More specifically, the voltages/currents produced in different portions of the coil near the different magnetostrictive elements would be opposite in sign and, hence, would result in cancellation of some or all of the induced voltage created. Winding separate coils around each magnetostrictive element allows the power generated by each magnetostrictive element to be harvested independently, without such a cancelling effect (or with only trivial or minimized effects).

The beam assembly (and separate magnetostrictive elements) may be supported at one or both ends, at one or more points/locations along the length, or any combination of the above. The specific geometry and location of the beam supports used may impact the locations, magnitude, and directions, of beam deflection, but in no way limit the overall scope of this invention.

In some embodiments, one end or portion of the beam assembly is fixed relative to the vibration source (i.e., relative to the vibrating equipment, device, or structure from with electric power is to be harvested), and the other end or portion(s) are allowed to move freely, thus forming a cantilever arrangement or other arrangement which allows for some deflection of a portion of the beam assembly. In some embodiments, the free end of the beam assembly could have a mass added to it to affect the natural frequency of deflection. To reduce the volume occupied by this mass, in some embodiments a material with very high density such as tungsten may be used for this mass. The mass may be of different materials and/or geometries, and if greater mass is needed, geometries that allow as much space within the packaging that can be utilized will be preferred. The specific material or geometry of the mass used in no way limits the scope of this invention. In some embodiments, the shape of the geometry is tailored to a specific operating condition and/or environment, for example, to magnify vibrations, to control oscillation periods, to facilitate fluid flow past the mass, or to accommodate another operating condition.

In at least one embodiment, the dimensions of the device and the amount of added mass can be varied to match the natural frequency of the structure to the dominant frequency of the vibration source in order to increase or maximize power output. The structural stiffness is directly proportional to the natural frequency, whereas the added mass has an inverse relationship to the natural frequency.

One possible application of the device is to provide electric power in remote locations. Some embodiments of the device may be configured as a downhole power source for electronic equipment in drilling or well formation/completion applications, or for trickle charging batteries or other energy storage devices. In some embodiments, multiple devices may be housed inside a single enclosure, for examine, an annular structure. Each device could be designed such that its natural frequency is slightly different from the other devices in the enclosure, which would allow for more power production across a range of vibration frequencies. The orientation of each device could also be varied in order to capture the vibrational energy in many directions. In another embodiment, one or more of the beam assemblies may be oriented at a different angle with respect to the radii of the pipe. For example, in one embodiment, the beam assemblies may be rotated approximately 90 degrees so that the vibrational movement is in the radial direction. In another example, some of the beam assemblies may be aligned with radial directions while other beam assemblies are aligned with annular directions. Each device may be magnetically isolated from the other devices and the enclosure in order to maintain the integrity of the magnetic circuit.

Some embodiments may be particularly useful in mounting around drill strings, drill collars, etc. Some embodiments of the device may be used in combination with and/or integrated into other devices/tools used downhole. These tools/devices may be located on the bottom hole assembly (BHA). These tools/devices may include, without limitation, measurement while drilling (MWD) tools, logging while drilling (LWD) tools, power packs, acoustic and/or electromagnetic signal generators, acoustic and/or electromagnetic signal boosters, acoustic and/or electromagnetic signal transmitters/repeaters, and so forth.

The device may also include or be used in combination with power electronics to convert the output electrical energy into a more desirable form. These electronics may include, without limitation, capacitive reactive power correction, single and/or poly-phase rectification (active and or passive), voltage regulation, voltage multipliers and/or transformers for increasing or decreasing voltage, buck, boost or buck-boost converters, voltage and/or current modulation, and other subcomponents.

Some embodiments of this device are particularly suitable to use with low cost magnetostrictive alloys, and do not require the use of the more expensive, supply-limited giant magnetostrictive materials that have terbium or gallium as part of their composition. Some embodiments may utilize metal alloys where iron and aluminum are the main constituents as the magnetostrictive elements. Some embodiments may utilize metal alloys that contain iron and aluminum where the iron atomic weight % is at least 75% and the aluminum atomic weight % is at least 2%. More specifically, some embodiments may utilize metal alloys that contain iron and aluminum where the iron atomic weight % is at least 80% and the aluminum atomic weight % is at least 12%. More specifically, some embodiments may utilize metal alloys that contain iron and aluminum where the iron atomic weight % is 81-83% and the aluminum atomic weight % is 17-19%.

In some embodiments, the conductive coil may be wound directly on the magnetostrictive elements. In other embodiments, the coil may be designed such that there is some clearance between each magnetostrictive element and the corresponding coil, where the deflection of the magnetostrictive element can be accommodated. In some embodiments, the coil may be mechanically coupled to the magnetostrictive elements or the external packaging with bonding materials or fixtures, which may include without limitation screws, bolts, epoxies (e.g., high temperature epoxies) or other adhesives or other methods familiar to those skilled in the art. Embodiments where the coil may be wound on or otherwise mechanically coupled to the magnetostrictive elements may result in higher effective beam stiffness than in cases where the coil is not mechanically coupled to the magnetostrictive elements. Such an increase in beam stiffness may require design changes such as added mass to keep the natural frequency of the overall beam assembly at a desired target frequency.

In some embodiments, the magnets are rare earth permanent magnets with ability to operate at higher temperatures. In some embodiments, particular grades of rare earth Nd—Fe—B permanent magnets that can operate up to 200° C. may be used (for instance "NEH"). In some embodiments, samarium-cobalt based rare earth permanent magnets that can be used up to 300° C. may be used.

The magnetomotive force MMF may be lowered by any number of methods known to those skilled in the art, including without limitation, using magnets with reduced thickness (or reduced volume) or using different magnet materials with lower coercivity. The circuit reluctance may be adjusted by using any number of methods familiar to those skilled in the art, including without limitation, using materials in the flux path with relatively low relative magnetic permeability (e.g. steels with relatively permeability lower than 100), introducing very small air gaps or spacers of very small thickness and extremely small relative permeability (e.g., aluminum).

Since magnetostrictive alloy materials generally have less mechanical strength and fracture toughness relative to structural alloys, some embodiments may incorporate manufacturing processes and designs that can result in enhanced component reliability during operation. These techniques may include, without limitation, hot/cold rolling (or otherwise mechanically working) the magnetostrictive elements during manufacturing or pre-compressing the magnetostrictive elements to a load level where the stress will never become tensile (or exceed a design stress target) during operation.

In addition to providing enhanced reliability, pre-stressing can also provide enhanced mechano-magnetic performance and therefore enhanced power densities. Therefore, some embodiments of the device may incorporate some form of pre-compression of the alloy materials in the beam. This may be done by any number of methods familiar to those skilled in the art. As one example, this may be accomplished by mechanical pre-stressing or thermal pre-stressing. Mechanical pre-stressing may be accomplished through the use of compression fixtures in which the alloy is tightened down using bolts. Thermal pre-stressing may be accomplished by incorporating the beam into an external loading fixture at an elevated temperature above the expected temperature of operation. When the fixture is at the effective temperature of operation, the beam will therefore be in compression and by designing the geometry of the fixture relative to the beam, a design target stress can be attained.

Rare earth permanent magnet materials, being non-structural ceramics, are intrinsically brittle and have low fracture toughness. Therefore, some embodiments of the device will incorporate design features that will allow the magnet materials to be packaged so that they can survive mechanical shock and vibration. This may be accomplished by any number of methods familiar to those skilled in the art, including without limitation methods by which the magnets may be compressed down using soft and/or ductile materials.

Further, some embodiments will include reliable packaging which will not only protect the internal components of the device from hot corrosive liquids and gases, as well as from drilling mud and any other constituents of the operating environment. Some embodiments may also incorporate a partial of full vacuum within the packaging to minimize mechanical damping effects due to air resistance acting on the beam assembly.

In one embodiment, the device includes an electric power generator for use in an environment where mechanical load changes are present or can be produced. The embodiment includes a magnetostrictive rod assembly with one or more magnetostrictive elements which are oriented in such a way as to experience at least a part of the mechanical load changes experienced by a drill-string (or other equipment); a coil assembly in proximity to magnetostrictive alloy material; a source of magnetomotive force (MMF), including permanent magnet material and/or electromagnets.

One or more magnetostrictive elements may be arranged to enable magnetic coupling between them. The magnetostrictive elements also may be arranged to form a substantially closed magnetic circuit, with minimal air gaps. The magnetostrictive elements may be incorporated into a downhole tool specifically designed primarily for electrical power generation, or may be may be designed to be incorporated into other downhole tools to provide at least a portion of the power required by such tools or to charge rechargeable batteries so as to extend the time that the batteries can be used before requiring them to be recharged by other methods.

The mechanical load alters the magnetic characteristics of the magnetostrictive elements, which results in electromagnetic induction of a voltage in the coil assembly.

In some embodiments, the magnetostrictive elements are in a state of stress (termed "pre-stress") in the static configuration. This pre-stress may enhance or optimize the change in magnetic characteristics caused by mechanical load changes, especially if at least a portion of the load changes experienced are in tension.

In some embodiments, the arrangement of the magnetostrictive elements, MMF source, and mass assembly form a closed magnetic circuit. This closed magnetic circuit may enhance or maximize the initial magnetic flux and magnetic characteristic changes due to the mechanical load changes.

One embodiment of the device includes at least one magnetostrictive element within a rod based assembly. The individual magnetostrictive elements may be conceptualized as individual rods (with lengthwise dimensions that are substantially greater than cross-sectional dimensions). The magnetostrictive element may have any length or cross-sectional geometry. In some preferred embodiments, the beam will have a substantially cylindrical geometry. In an embodiment in which the cross-section of the magnetostrictive elements is rectangular, the longer dimension of the rectangular prism is approximately parallel to the direction of dominant load changes.

Some embodiments of the device contain more than one magnetostrictive element. In some embodiments, two or more magnetostrictive elements may form part of the magnetic circuit and share the mechanical load changes, which may result in a greater magnetic circuit reluctance change than if each of the rods were part of separate magnetic circuits, the net effect being that the flux density changes experienced by each rod (and therefore the energy production from each rod) is greater for such embodiments.

In some embodiments, coils may be wrapped around each magnetostrictive element individually such that the coils pass through the space between the magnetostrictive elements. As mentioned above, the magnetostrictive elements may form separate parts of a substantially closed (i.e., without substantial air gaps) magnetic circuit, which could be completed at both ends of the structure by magnetically permeable materials and/or magneto-mechanical force (MMF) sources (e.g., permanent magnet material, electromagnets, etc.). In some embodiments, these materials would be placed in the gap at both ends of the magnetostrictive elements to form a closed flux path.

The rod assembly (and separate magnetostrictive elements) may comprise a separate downhole tool for power production, or may be incorporated into new or existing downhole tools in the BHA or drill string. The specific geometry and location of the beam supports used may impact the locations, magnitude, and directions, of rod stresses and power production, but in no way limit the overall scope of this invention.

In some embodiments, the device may comprise multiple rods and may be built in a configuration that it occupies an annular space. This geometry has the benefit that the drilling fluid (mud) can flow inside the cylindrical bore of the device, which is highly desirable for downhole tools. Further, the device may incorporate multiple flux paths each of which includes two magnetostrictive rods and at least one MMF source, preferably a rare earth permanent magnet that can survive the high-temperature downhole operating environment without a significant degradation in performance.

In some embodiments, the magnetostrictive elements may be magnetically coupled with external flux path members that have coils around them. The changes in stress/strain in the magnetostrictive elements result in changes in flux in the magnetostrictive elements, as well as in the external flux path members, and coils may be placed around the external flux path members and/or the magnetostrictive elements so that the changes in magnetic flux can result in an induced current/voltage in these coils. This design allows for the length of the flux path and/or the number of turns of coil to be significantly greater than if coils are wound around the magnetostrictive elements only. Further, the average diameter (or significant dimensions) of each turn of coil may be smaller in this configuration than if the coils are wound around the magnetostrictive elements alone. This can result in a lower device internal resistance for a certain number of turns of coil, and consequently higher power density.

In some embodiments, the conductive coil may be wound directly on the magnetostrictive elements. In some other embodiments, the coil may be designed such that there is some clearance between each magnetostrictive element and the corresponding coil, where the Poisson's strain of the magnetostrictive element can be accommodated. In some embodiments, the coil may be mechanically coupled to the magnetostrictive elements or the external packaging with bonding materials or fixtures, which may include without limitation screws, bolts, epoxies (e.g., high temperature epoxies) or other adhesives or other methods familiar to those skilled in the art.

In some embodiments, the magnets are rare earth permanent magnets with ability to operate at higher temperatures. In some embodiments, particular grades of rare earth Nd—Fe—B permanent magnets that can operate up to 200° C. may be used (for instance "NEH"). In some embodiments, samarium-cobalt based rare earth permanent magnets that can be used up to 300° C. may be used.

Since the cross-sectional area of the magnetostrictive elements is small compared with the length, care must be taken not to have the magnetomotive force MMF too high or flux path magnetic reluctance too low so as to saturate all or some of the flux path components. The magnetomotive force MMF may be lowered by any number of methods, including without limitation, using magnets with reduced thickness (or reduced volume) or using different magnet materials with lower coercivity. The circuit reluctance may be adjusted by using any number of methods, including without limitation, using materials in the flux path with relatively low relative magnetic permeability (e.g., steels with relatively permeability lower than 100), introducing very small air gaps or spacers of very small thickness and extremely small relative permeability (e.g., aluminum).

Since magnetostrictive alloy materials generally have less mechanical strength and fracture toughness relative to structural alloys, some embodiments are made using manufacturing processes and designs that can result in enhanced component reliability during operation. These techniques may include, without limitation, hot/cold rolling (or otherwise mechanically working) the magnetostrictive elements during manufacturing or pre-compressing the magnetostrictive elements to a load level where the stress will never become tensile (or exceed a design stress target) during operation.

In addition to providing enhanced reliability, pre-stressing can also provide enhanced mechano-magnetic performance and therefore enhanced power densities. Therefore, some embodiments of the device may incorporate some form of pre-compression of the alloy materials in the beam. This may be done by any number of methods. As one example, this may be accomplished by mechanical pre-stressing or thermal pre-stressing. Mechanical pre-stressing may be accomplished through the use of compression fixtures in which the alloy is tightened down using bolts. Thermal pre-stressing may be accomplished by incorporating the rod into an external loading fixture at an elevated temperature above the expected temperature of operation. When the fixture is at the effective temperature of operation, the rod will therefore be in compression and by designing the geometry of the fixture relative to the rod, a design target stress can be attained.

Rare earth permanent magnet materials, being non-structural ceramics, are intrinsically brittle and have low fracture toughness. Therefore, some embodiments of the device incorporate design features that will allow the magnet materials to be packaged so that they can survive mechanical shock and vibration. This may be accomplished by any number of methods, including without limitation methods by which the magnets may be compressed down using soft and/or ductile materials.

Further, some embodiments include reliable packaging which will not only protect the internal components of the device from hot corrosive liquids and gases, as well as from drilling mud and any other constituents of the operating environment.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An apparatus for harvesting electrical power, the apparatus comprising:
a magnetostrictive component having an internal pre-stressed magnetostrictive core,
wherein a magnetic property of the magnetostrictive core is configured to change with changes in stress within the magnetostrictive core along at least one direction within the magnetostrictive component,
wherein changes of stress within the magnetostrictive core are at least partially due to changes in an external mechanical load applied to the apparatus, and consequently changes the magnetic property,
wherein the magnetostrictive component is also configured such that the change in the magnetic property will result in a change in magnetic flux, which change can be used to generate electrical power.

2. The apparatus of claim 1, wherein the magnetic property is magnetic permeability.

3. The apparatus of claim 1, wherein the magnetostrictive core is magnetically coupled with an electrically conducting coil, wherein changes in magnetic flux within the magnetostrictive core results in electrical energy generation in the electrically conducting coil.

4. The apparatus of claim 1, wherein the pre-stressed magnetostrictive core is pre-stressed in compression.

5. The apparatus of claim 1, wherein the pre-stressed magnetostrictive core is pre-stressed using other mechanical structural components.

6. The apparatus of claim 1, wherein the pre-stressed magnetostrictive core is pre-stressed using structural plates that are tightened down onto the magnetostrictive core using threaded rods.

7. The apparatus of claim 1, wherein the pre-stressed magnetostrictive core has a bias magnetic field applied to it through the use of one or more magnets.

8. The apparatus of claim 7, wherein one or more of the magnets is a permanent magnet.

9. The apparatus of claim 7, wherein the bias magnetic field is directed through the magnetostrictive core through the use of one or more flux paths comprising magnetically permeable material.

10. The apparatus of claim 1, wherein the magnetostrictive component is attached to a drilling rig, and wherein forces due to fluid motion of drilling mud results in changes of stress within the magnetostrictive core.

11. The apparatus of claim 1, wherein changes in the external mechanical load are caused by fluid motion.

12. The apparatus of claim 1, wherein changes in the external mechanical load are caused at least partially by interactions of a fluid with the apparatus.

13. The apparatus of claim 1, wherein changes in the external mechanical load are caused by structural vibrations of a component in an oil drilling rig.

14. The apparatus of claim 1, wherein changes in the external mechanical load are caused by a mechanical load transferred to the magnetostrictive component from a component used in an oil drilling operation.

15. A method for precompressing a magnetostrictive component for harvesting electrical power, the method comprising:
loading a magnetostrictive component into a frame unit, the magnetostrictive component comprising a magnetostrictive core positioned between two structural plates;
compressing the magnetostrictive core by activating a mechanical compression unit, wherein the mechanical compression unit compresses the magnetostrictive core by applying force to the structural plates;
attaching at least one rod between the structural plates; and
fastening the at least one rod to the structural plates with a fastening unit.

16. The method of claim 15, further comprising applying a bias magnetic field to the pre-stressed magnetostrictive core through the use of one or more magnets.

17. The method of claim 16, wherein the bias magnetic field is directed through the magnetostrictive core through the use of one or more flux paths comprising magnetically permeable material.

18. A method for generating electrical power, the method comprising deploying an apparatus comprising a magnetostrictive component, the magnetostrictive component comprising a precompressed magnetostrictive core;

changing a magnetic property of the magnetostrictive core by changing a force due to stress within the magnetostrictive core along at least one direction within the magnetostrictive component, wherein changing the force due to stress is at least partially due to an external mechanical load applied to the magnetostrictive component, and wherein changing the magnetic property further results in a change in magnetic flux, which can be used to generate electrical power.

19. The method in claim 18, wherein changes in the external mechanical load are caused at least partially by interactions of a fluid with the apparatus, wherein the fluid comprises wind.

20. The method in claim 18, where the changes in mechanical load are caused by mechanical interaction of the magnetostrictive component with a component used in an oil drilling operation.

\* \* \* \* \*